United States Patent [19]
Treibergs et al.

[11] Patent Number: 6,045,370
[45] Date of Patent: Apr. 4, 2000

[54] TEST SOCKET FOR ELECTRONIC MODULE

[75] Inventors: Valts Edgars Treibergs, South Bend, Ind.; Craig Joseph Reske, Niles, Mich.

[73] Assignee: Wells-CTi, Inc., South Bend, Ind.

[21] Appl. No.: 08/942,505

[22] Filed: Oct. 2, 1997

[51] Int. Cl.[7] ................................................. H01R 9/09
[52] U.S. Cl. .............................................. 439/73; 439/487
[58] Field of Search ............................... 439/72, 73, 331, 439/487

[56] References Cited

U.S. PATENT DOCUMENTS

| | | | |
|---|---|---|---|
| 3,917,375 | 11/1975 | Johnson | 439/487 |
| 5,409,392 | 4/1995 | Marks et al. | 439/73 |
| 5,460,538 | 10/1995 | Ikeya | 439/73 |

Primary Examiner—Steven L. Stephan
Assistant Examiner—T C Patel
Attorney, Agent, or Firm—Baker & Daniels

[57] ABSTRACT

A socket for establishing a releasable connection between terminals of electronic modules and a circuit board includes a base having a module support surface for supporting the module in test position. A contact holder cooperates with the base for supporting contact elements for each terminal of the module. Each of the contact modules include a projecting portion projecting from the socket and before engagement with the circuit board, a support section which is supported on the contact holder in grooves defined between ribs and oriented with respect thereto by tabs on the contact elements engaging gaps in the grooves, and a deflecting section which extends over slots in the contact holder. When a module to be tested, the module is placed on the test surface and a lid pivotally mounted on the socket is closed to thereby push the terminals into engagement with the contact elements and thereafter downward force being accommodated by deflection of the deflectable portion of the contact elements into the grooves. A heat sink carried by the socket drains thermal energy from the module.

14 Claims, 10 Drawing Sheets

TEST SOCKET FOR ELECTRONIC MODULE

This invention relates to a socket for establishing a releasable connection between terminals for an electronic module and a circuit board.

Electronic modules must be tested during the manufacturing process. This testing is accomplished by establishing an electrical connection between the terminals of the module and a circuit board which is connected to test equipment. This testing is sometimes effected momentarily, and test contactors are used for rapidly establishing and disconnecting a connection between the module and the circuit board for this momentary testing. However, electronic modules must also be tested for extended periods. This so-called "burn in" testing requires that the module be placed in a socket to establish the connection between the terminals of the module and the circuit board. Since "burn in" testing is conducted for extended periods of time, heat must be dissipated from the module. Furthermore, it is also necessary that the actual connection be effected rapidly, and that the electrical path between the terminals of the module and the circuit board be as short as possible.

The present invention provides a socket which includes a contact holder which holds relatively thin contact elements, one contact element for each of the terminals of the electronic module. The socket also includes a base which provides a module support surface and which cooperates with the contact holder to retain the contact elements in place. Each contact element includes an engagement portion which projects above the level of the support surface for engagement by the terminals of the module, a projecting portion which projects from the contact holder for engagement with the circuit board, a supporting section which is oriented on the contact holder by ridges which define grooves to receive and orient the supporting portion of the contact element, and a deflecting portion which deflects into slots defined in the contact holder when pressure is applied to the engagement portion as the electronic module is moved toward the module support surface. Accordingly, deflection of the projecting portion of the contact element is accommodated, an electrical connection between the module and the circuit board is efficiently and effectively made, and the contact elements are as short as possible. A hinged lid is moved over the support surface and latched in place after the module is installed in the socket. The lid includes a rib which engages the terminals and forces the latter against the engagement portions of the contact elements, and then deflects the contact elements so that the deflecting portion deflects into the slots. Alternatively, the socket may be used as a momentary test contactor if the lid is removed or not used.

These and other advantages of the present invention will become apparent from the following description, with reference to the accompanying drawings, in which.

Figure 1:
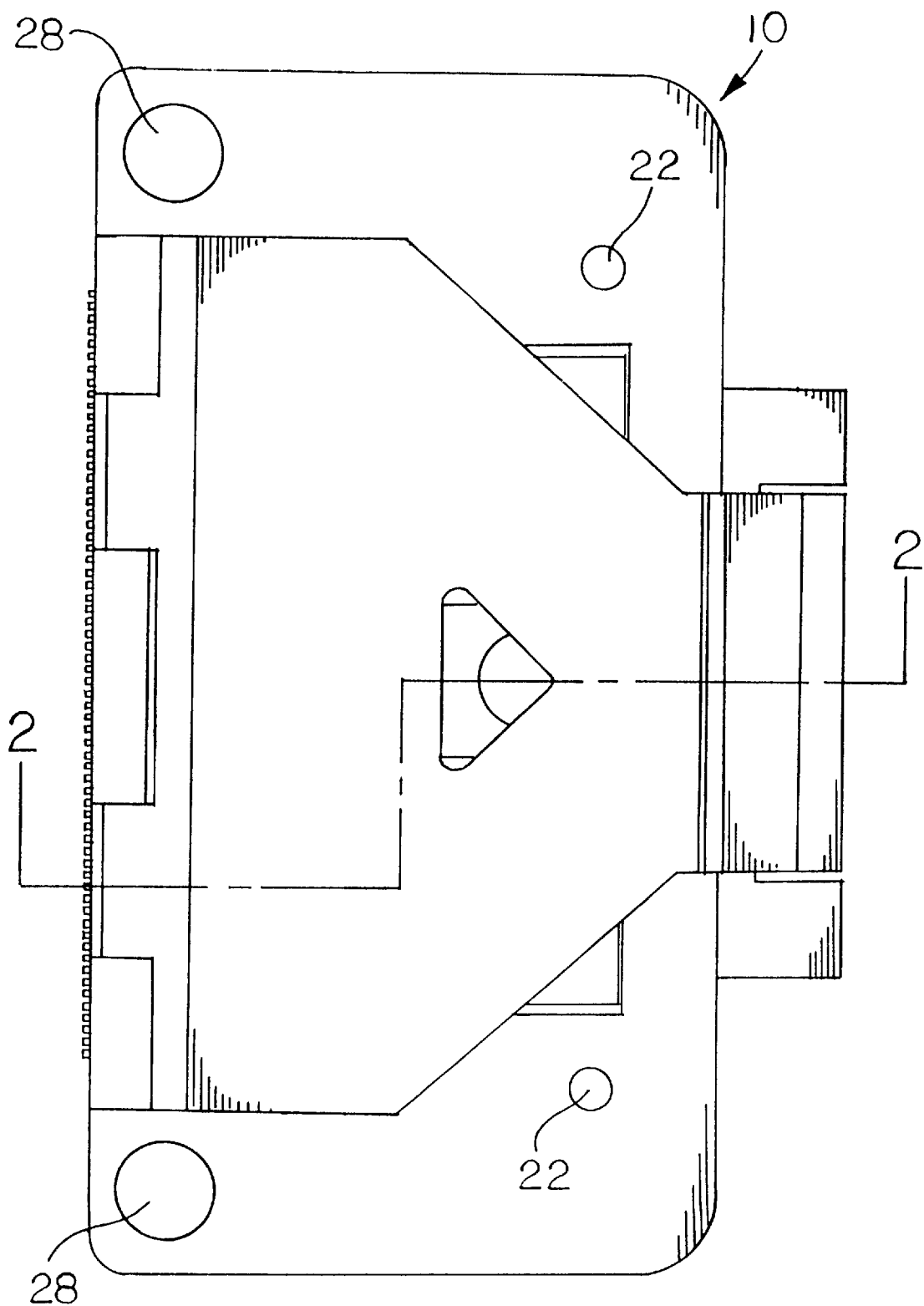
FIG. 1 is a top plan view of a socket made pursuant to the teachings of the present invention.
Figure 2:
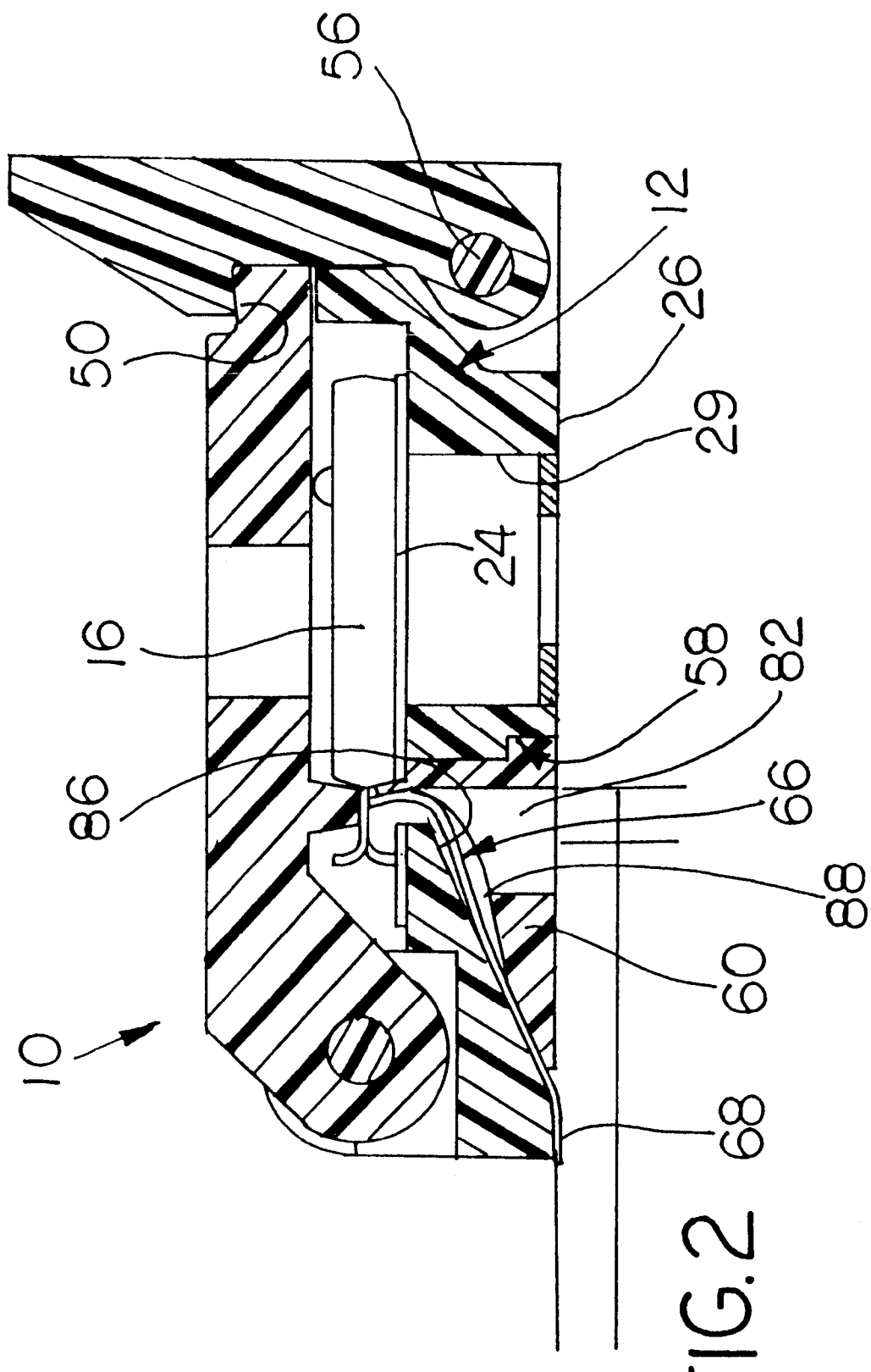
FIG. 2 is a cross-sectional view taken substantially along lines 2—2 of FIG. 1.
Figure 3:
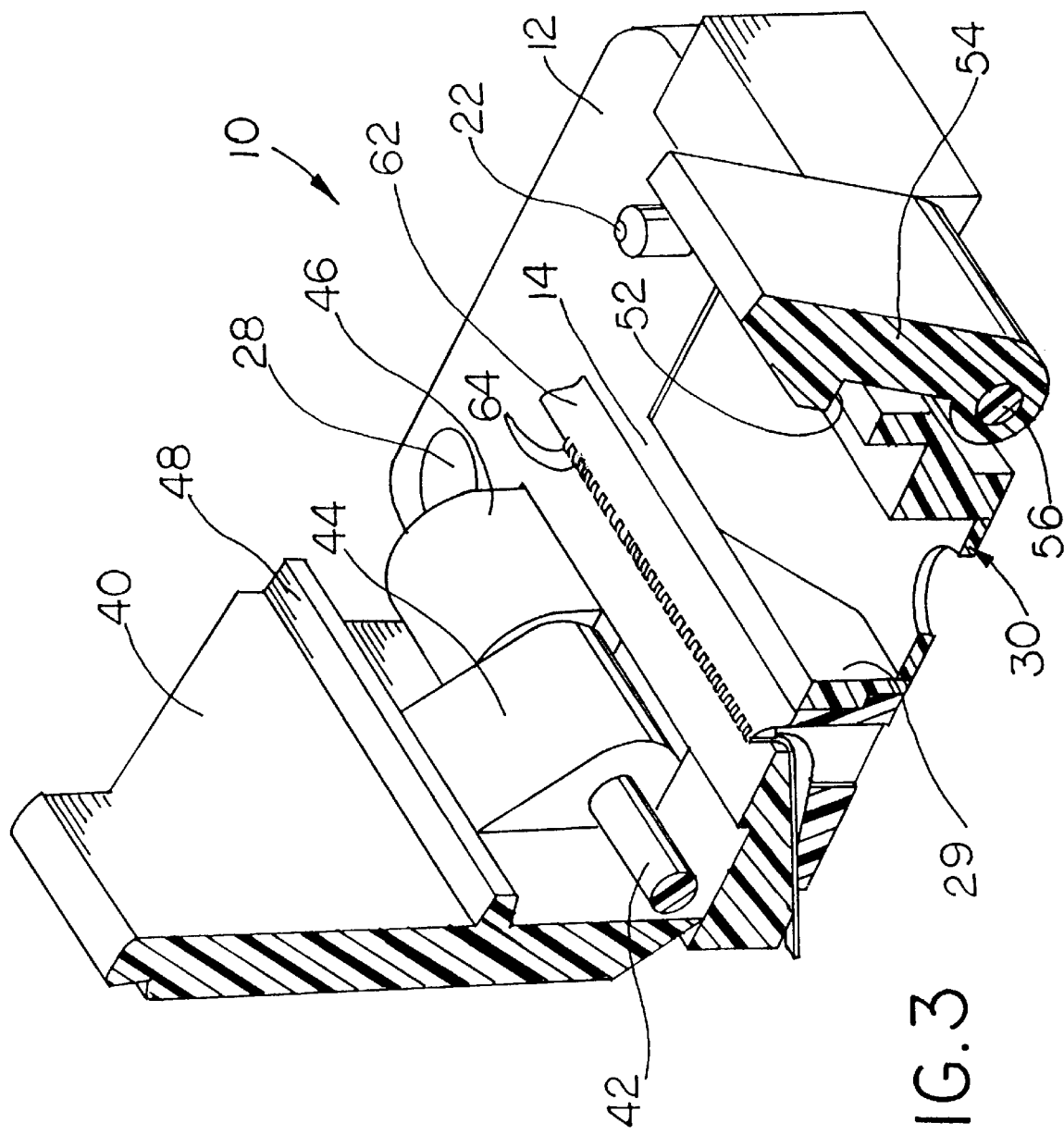
FIG. 3 is a perspective view, in section, of the socket illustrated in FIGS. 1 and 2, the socket being illustrated with the lid open and the electronic module removed.
Figure 4:
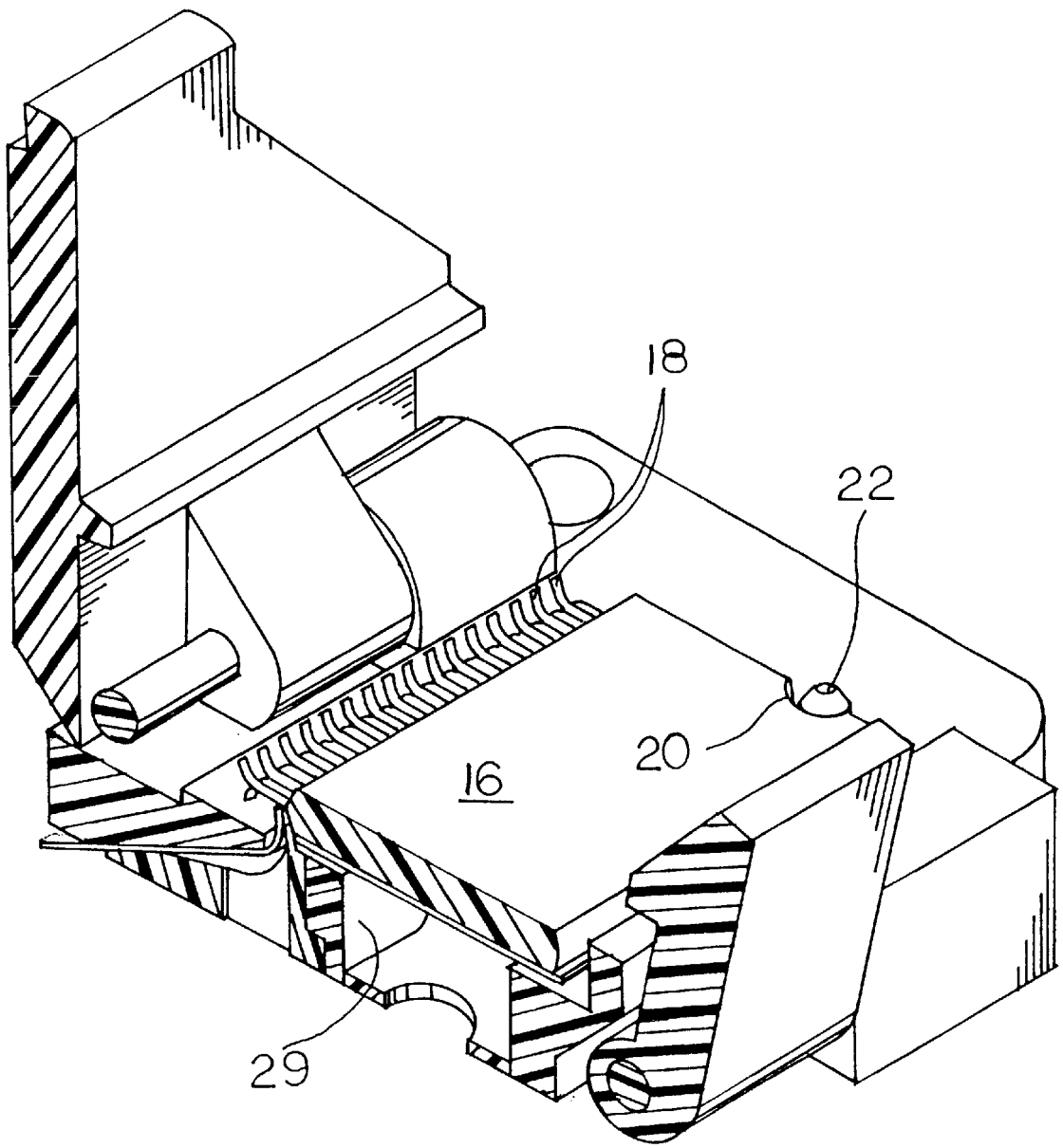
FIG. 4 is a view similar to FIG. 3, but illustrating the electronic module installed in the socket before the lid of the socket is closed.
Figure 5:
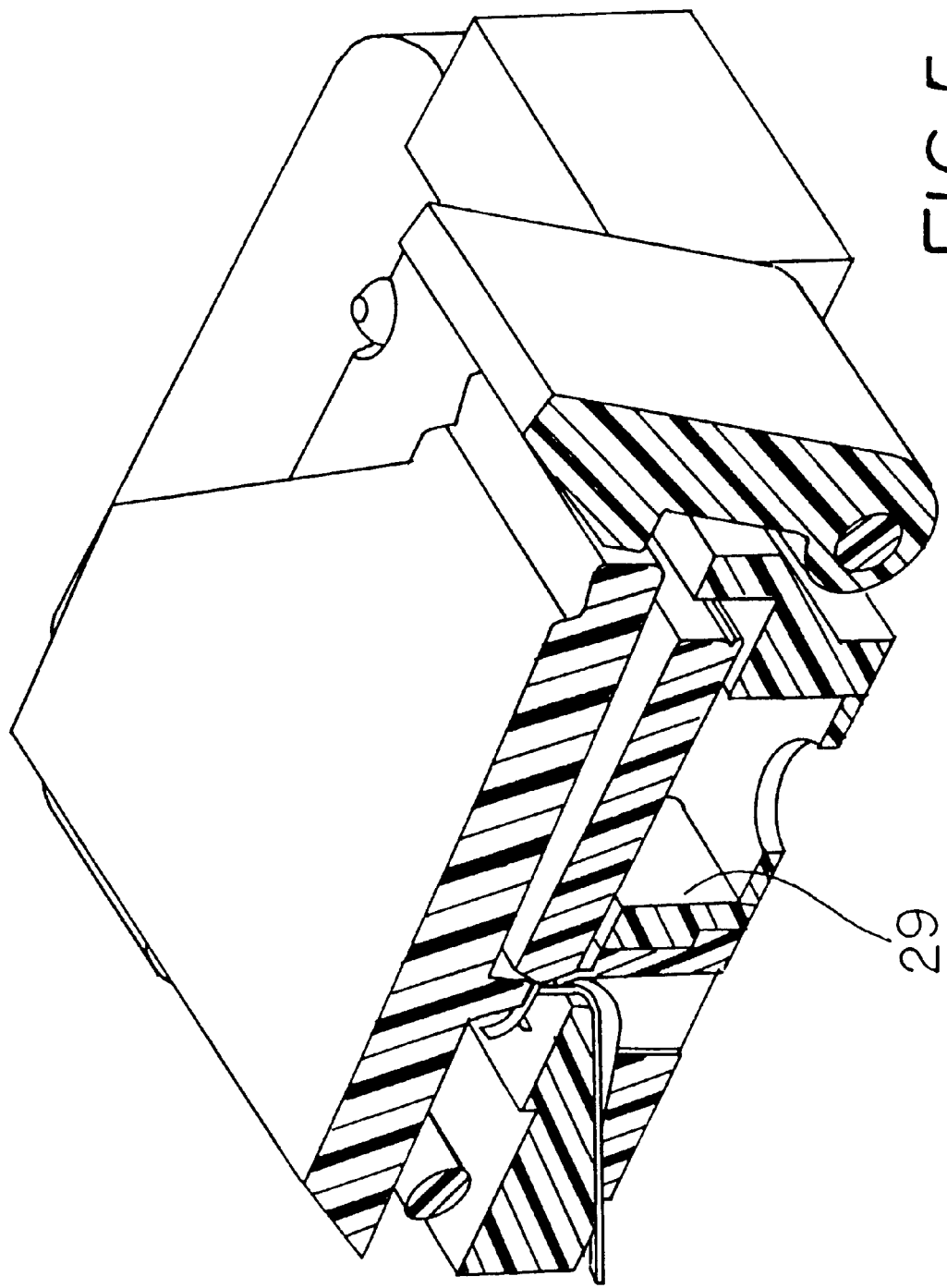
FIG. 5 is a view similar to FIGS. 3 and 4, but illustrating the lid closed without being latched.
Figure 6:
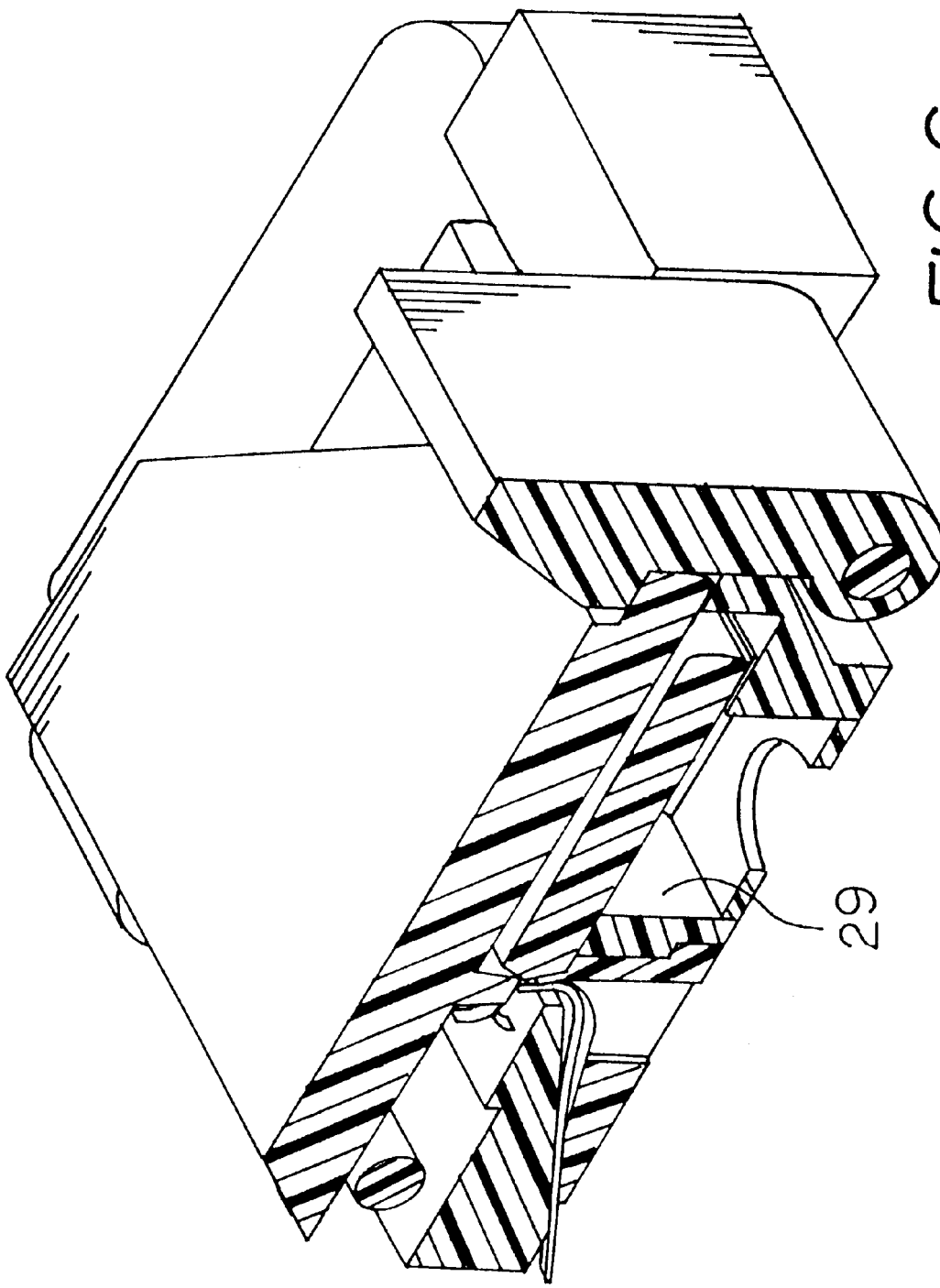
FIG. 6 is a view similar to FIG. 5, but illustrating the lid closed and latched.

Referring now to the drawings, a socket generally indicated by the numeral 10 includes a base 12 defining a support surface 14 which supports an electronic module 16 having multiple terminals 18 extending along one side thereof. Module 16 is provided with recesses 20 on opposite ends thereof which engage corresponding alignment pins 22 projecting upwardly from the base 12. Electronic module 16 further includes a heat sink 24 on the lower side thereof. The lower side 26 of the base 12 is adapted to engage the aforementioned circuit board (not shown), and the socket 10 is secured to the circuit board by appropriate fasteners (not shown), received through apertures 28. The support surface 14 extends around the perimeter of an opening 29 which extends all of the way through the base 12. A thermally conductive member or heat sink generally indicated by the numeral 30 includes a portion 32 which is attached to the aforementioned circuit board, and a pair of arms 34, each of which include an inclined portion 36 and a supporting portion 38 which is substantially flush with the support surface 14. The supporting portions 38 engage the heat sink 24 on the module 16 to thereby drain heat from the module 16 through the heat sink 24 and into a corresponding heat sink area on the circuit board to which the base portion 32 is attached.

The base 12 carries a lid 40 which is pivotally connected to the base 12 by a pivot pin 42 which extends through ears 44 on the lid 40 and ears 46 extending upwardly from the base 12. The lid 40 also includes a rib 48 which extends along the lid 40 and is adapted to engage the terminals 18 when the module 16 is installed on the socket 10 as will hereinafter be described. The lid 40 includes a recessed portion 50 which is adapted to be engaged by a projecting ledge 52 of a latch member 54 which is pivotally connected to the base 12 by a pivot pin 56.

The base 12 includes a recess generally indicated by the numeral 58 that receives a contact element holder generally indicated by the numeral 60. The contact holder 60 includes a curved projecting portion 62 that projects upwardly above the support surface 14 and supports the engagement portions 64 of multiple contact elements generally indicated by the numeral 66. The other end of the contact elements 66 terminate in a projecting portion 68 which project away from the contact holder 60 for engagement with appropriate portions of the aforementioned printed circuit board.

Figure 7:
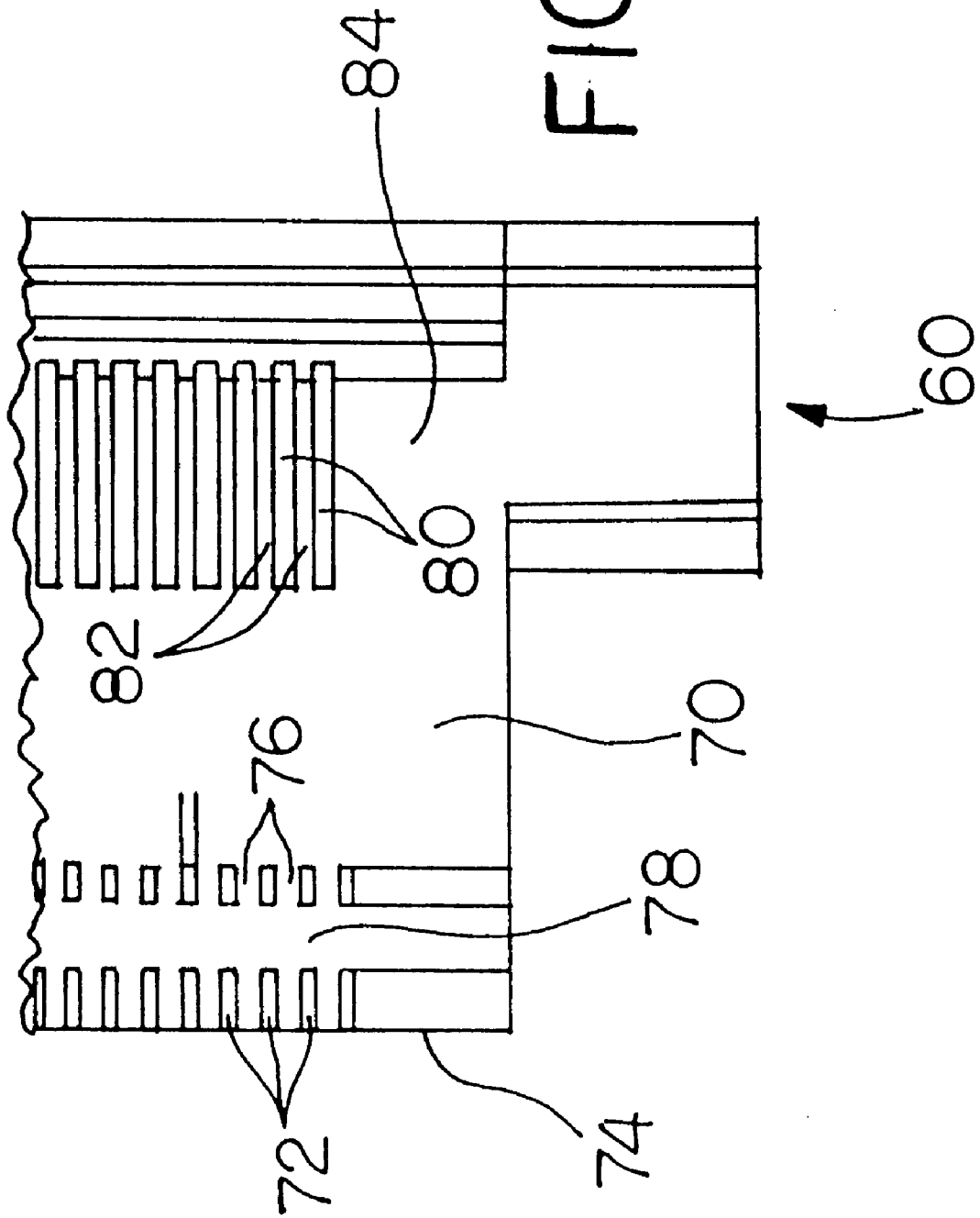
FIG. 7 is a fragmentary top plan view of the contact holder used in the socket illustrated in FIGS. 1–6.

Referring now to FIG. 7, the contact elements 66 are supported on the upper surface 70 of the contact holder 60. Upwardly extending ridges 72 adjacent the outer end 74 of the upper surface 70 define grooves 76 therebetween. Each of the ridges include a gap 78. Aligned with each of the grooves 76 are slots 80 which extend downwardly into the contact holder 60 and are separated by partitions 82. The portion 84 of the surface 70 cooperates with undersurface 86 on the base 12 to define a recess 88 therebetween.

Figure 8:
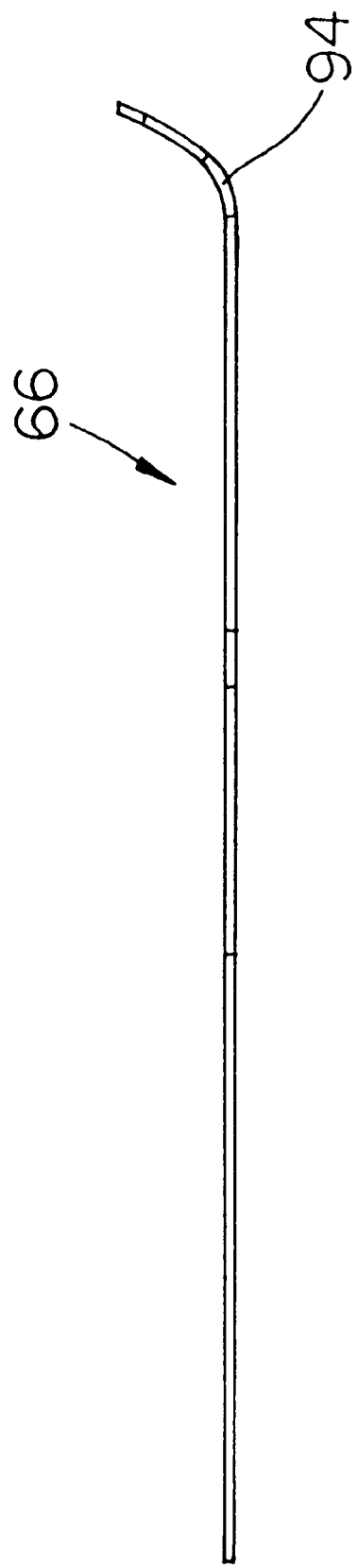
FIG. 8 is an elevational view of contact elements used in the socket illustrated in FIGS. 1–7.
Figure 9:
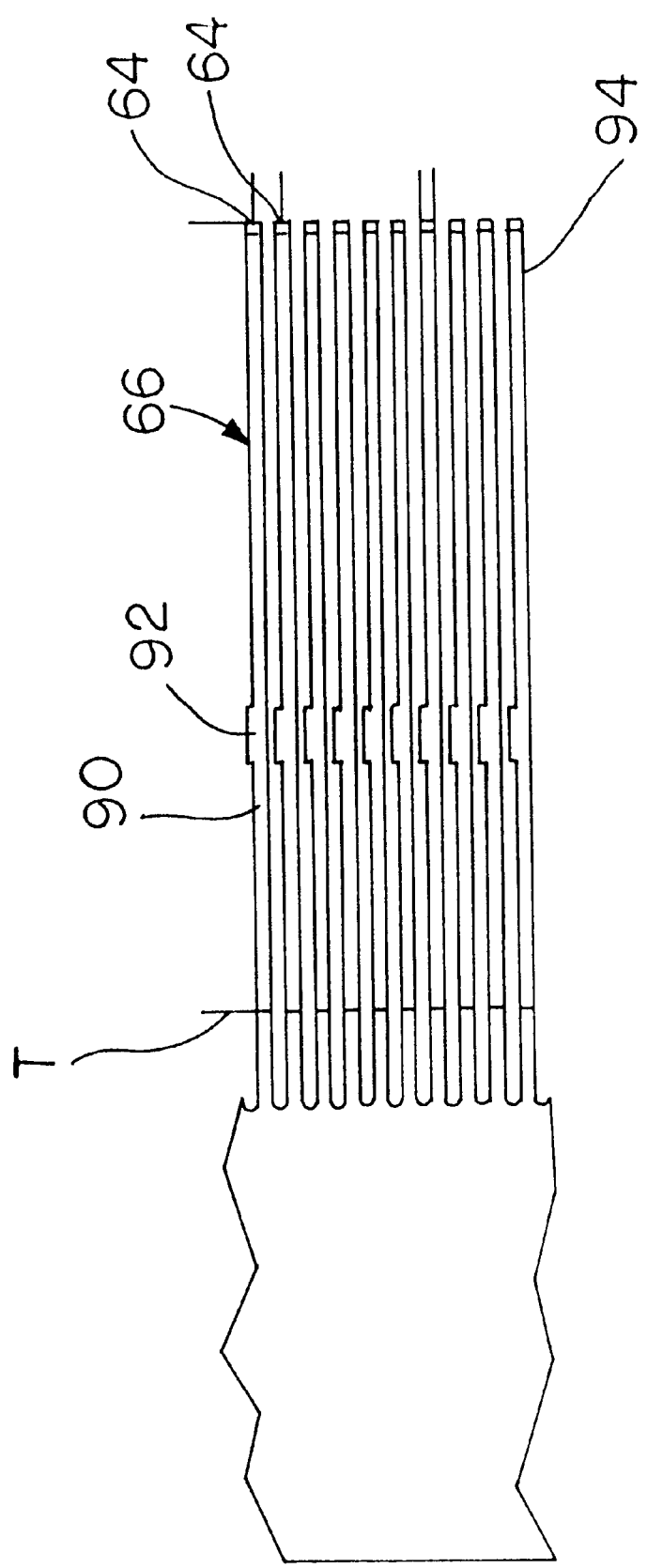
FIG. 9 is a top view of a set of contacts used within the socket illustrated in FIGS. 1–7, but before the elements have been installed in the socket and the ends trimmed off.
Figure 10:
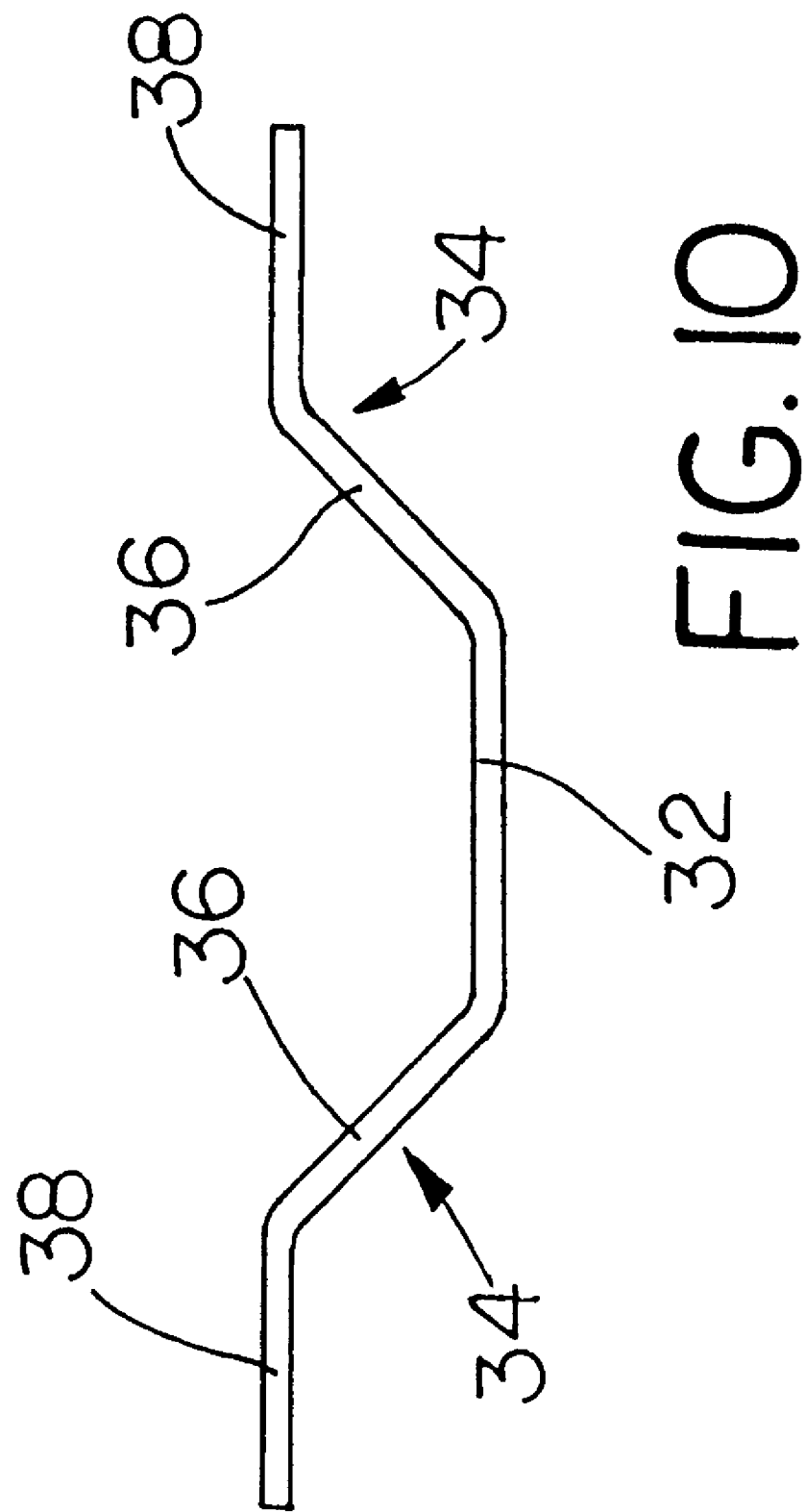
FIG. 10 is a side elevational view of the heat sink used in the socket illustrated in FIGS. 1–7.

Referring now to FIGS. 8 and 9, contact elements 66 are stamped from a single sheet of metal or other conductive material and each include a supporting portion 90 including a transversely extending tab 92. The supporting portion 90 extends from the projecting portion 88 and is received in corresponding grooves 76 when the elements 66 are installed on the contact holder 60. After the contact elements 66 are installed in the corresponding grooves 76 with the tabs 92 extending into the gaps 78 to thereby orient the contact element 66 along the length of the contact holder, the contact elements are trimmed along trim line T (FIG. 9) and the material trimmed off is discarded. Contact elements 66 also include a deflecting portion 94 which extends through the recess 66 and over the slots 80.

When a module 16 is to be tested, the module is placed on the support surface 14 with the alignment pins 22 in engagement with the recess 20. At least a portion of the heat sink 24 of the module 16 rests on the support portions 38 of the heat sink 30. The terminals 18 of the module 16 will then rest upon corresponding engagement portions 64 of the contact elements 66. The lid 40 is then closed over the module 16. The rib 48 extends from the lid 40 such that the rib 48 engages the terminals 16 and forces them against the engagement portions 64 of the contact elements 66. As the lid is closed further, the contact elements 66, and in particularly the deflecting portions 94 thereof, are deflected within the recess 86 and then a small distance into the corresponding slots 82. Accordingly, the slots 82 accommodate downward depression of the contact elements 66 as the terminals 16 are forced against the engagement portion 64 by engagement of the rib 48 with terminals 16 as the lid 40 is closed. Therefore, proper electrical contact is established and maintained between the terminal 16 and the contact elements 66, thereby permitting the proper "burn in" of the electronic module 16. The latch 54 is closed by engaging projecting ledge 52 with recess 50 on the lid 40, but the latch 54 can easily be disengaged from the lid 40 to permit removal of the module when "burn in" testing is completed. Accordingly, high frequency response is facilitated, because of the relatively short electrical path between the terminals 16 and the circuit board provided by the contact elements 66.

The lid is left open or removed, the socket may be used for the momentary testing of electronic modules by merely holding manually the module in the proper position with the pins 22 engaged with the recess 20 and then depressing the module so that the terminals 16 engage the engagement portion of the contact element 66. Accordingly, the socket 10 serves both as a socket for "burn in" testing of electronic modules and also serves as a test contactor for the momentary testing of electronic modules.

What is claimed:

1. Socket for establishing a releasable connection between terminals of an electronic module and a circuit board comprising a base having a module support surface for supporting said module in a test position, a contact holder cooperating with said base for supporting a contact element for each terminal of the module, each of said contact elements including a projecting portion projecting from said contact holder for engagement with said circuit board, an engagement portion extending from said module support surface for engagement with a corresponding one of said terminals, a supporting portion extending from said projecting portion and a deflecting portion between said engagement portion and said supporting portion which moves in response to deflection of the engagement portion as said terminals engage and thereafter deflect the engagement portion, said deflecting portion extending linearly from the supporting portion, before deflection of the deflecting portion, said contact holder including a slotted surface defining multiple slots therein including one slot for each contact element the deflecting section of each of said contact elements extending along and over its corresponding slot whereby the deflecting section of each contact element is deflected into a corresponding slot upon deflection of a corresponding engagement portion, said contact holder further including an inclined supporting surface extending between said circuit board and said slots for engaging the support portion of each said contact element.

2. Socket as claimed in claim 1, wherein a heat sink is mounted on said base and extends between said support surface and said circuit board, said heat sink being in thermal communication with said module to drain thermal energy from the module.

3. Socket as claimed in claim 2, wherein said support surface circumscribes an aperture in said base, said heat sink being mounted in said aperture and extending between said support surface and said circuit board.

4. Socket as claimed in claim 3, wherein said heat sink includes a central section engaging said circuit board and a pair of arms extending from said central section to said support surface.

5. Socket as claimed in claim 1, wherein each of said slots are separated from adjacent slots by partitions extending parallel to said slots and to said contact elements.

6. Socket as claimed in claim 1, wherein said slots are elongated and extend parallel to the contact elements and downwardly into said contact holder.

7. Socket as claimed in claim 1, wherein said supporting surface includes upwardly projecting ridges defining grooves therebetween having a width substantially equal to the width of the contact elements, said supporting portions extending between the deflecting section and the projecting portion, said supporting portions being received within said grooves to thereby orient said contact elements with respect to the contact holder.

8. Socket as claimed in claim 7, wherein said base extends over said grooves and the grooves orient the contact elements with respect to the contact holder and the base.

9. Socket as claimed in claim 7, wherein a heat sink is mounted on said base and extends between said support surface and said circuit board, said heat sink being in thermal communication with said module to drain thermal energy from the module.

10. Socket as claimed in claim 9, wherein said support surface circumscribes an aperture in said base, said heat sink being mounted in said aperture and extending between said support surface and said circuit board.

11. Socket as claimed in claim 1, wherein a lid is pivotally mounted on said base for movement from an open position exposing said support surface to permit installation and removal of said module and a closed position overlying said support surface.

12. Socket as claimed in claim 11, wherein a latch is mounted on said base, said latch engaging said lid in said closed position to lock the lid in the closed position.

13. Socket as claimed in claim 11, wherein said lid carries a rib, said rib engaging said terminals as the lid is moved into the closed position to force the terminals against the engagement portions of the contact elements and thereafter deflect the terminals and the contact elements whereby the deflecting sections of the contact elements are deflected into said recess.

14. Socket for establishing a releasable connection between terminals of an electronic module and a circuit board comprising a base having a module support surface for supporting said module in a test position, a contact holder cooperating with said base for supporting a contact element for each terminal of the module, each of said elements including a projecting portion projecting from said contact holder for engagement with said circuit board, an engagement portion extending from said module support surface for engagement with a corresponding one of said terminals, and a deflecting section between said engagement portion and said projecting portion which moves in response to deflection of the engagement portion as said terminals engage and thereafter deflect the engagement portion, said contact holder including a recess for receiving the deflection section of each contact element as said engagement portions are deflected by said terminals;

said recesses being multiple slots defined in said contact holder, the deflecting section of each of said contact elements extending along and over said slots whereby the deflecting section of each contact may be deflected into a corresponding slot upon deflection of a corresponding engagement portion;

said contact holder including upwardly projecting ridges defining grooves therebetween having a width substantially equal to the width of the contact elements, said contact elements including supporting portions extending between the deflecting section and projecting portion, said supporting portions being received within said grooves to thereby orient said contact elements with respect to the contact holder;

each supporting portion including a transversely extended tab, corresponding ones of said ridges including a gap receiving the tab whereby said tab orients the contact element in a predetermined position along the length of the grooves.

\* \* \* \* \*